(12) United States Patent
Guerrero et al.

(10) Patent No.: US 11,089,686 B2
(45) Date of Patent: Aug. 10, 2021

(54) DATA ACQUISITION DEVICE FOR THE INSTRUMENTATION OF A STRUCTURE

(71) Applicant: SAFRAN DATA SYSTEMS, Courtaboeuf (FR)

(72) Inventors: Ghislain Guerrero, Saint Cyr L'Ecole (FR); Olivier Pinto, Massy (FR)

(73) Assignee: SAFRAN DATA SYSTEMS, Courtaboeuf (FR)

(*) Notice: Subject to any disclaimer, the term of this patent is extended or adjusted under 35 U.S.C. 154(b) by 0 days.

(21) Appl. No.: 17/047,996

(22) PCT Filed: Apr. 19, 2019

(86) PCT No.: PCT/EP2019/060247
§ 371 (c)(1),
(2) Date: Oct. 15, 2020

(87) PCT Pub. No.: WO2019/202155
PCT Pub. Date: Oct. 24, 2019

(65) Prior Publication Data
US 2021/0144854 A1    May 13, 2021

(30) Foreign Application Priority Data
Apr. 19, 2018 (FR) ..................... 1853458

(51) Int. Cl.
*H05K 1/16* (2006.01)
*H05K 1/14* (2006.01)
(52) U.S. Cl.
CPC ....... *H05K 1/144* (2013.01); *H05K 2201/042* (2013.01); *H05K 2201/10151* (2013.01)

(58) Field of Classification Search
CPC ............. H05K 1/144; H05K 2201/042; H05K 2201/10151
See application file for complete search history.

(56) References Cited

U.S. PATENT DOCUMENTS 6,402,031 B1* 6/2002 Hall ....................... G05B 19/00
                                                                     235/400
2004/0160742 A1 8/2004 Weiss
(Continued)

OTHER PUBLICATIONS

French Preliminary Search Report dated Nov. 27, 2018 from the French National Institute of Industrial Property in Application No. 1853458.
(Continued)

*Primary Examiner* — Yuriy Semenenko
(74) *Attorney, Agent, or Firm* — Sughrue Mion, PLLC (57) ABSTRACT

The invention concerns a data acquisition device (10) comprising a casing (11) defining a cavity (20), and a plurality of electronic modules (12) suitable for being stacked in the cavity (20), each electronic module (12) having a first face and a second face opposite the first face, and comprising a first set of conductive tracks extending over the first face, and a second set of conductive tracks sending over the second face, the first set of conductive tracts comprising at least one conductive track for transmitting a data signal, and the second set of conductive tracks comprising at least one conductive track for transmitting the data signal, making it possible to propagate the data signal from one module to another through the entirety of the stack, whatever the order of stacking of the electronic modules (12) in the cavity (20).

18 Claims, 11 Drawing Sheets

(56) References Cited

U.S. PATENT DOCUMENTS

| | | | |
|---|---|---|---|
| 2011/0087720 A1* | 4/2011 | de Azambuja Turqueti | G06F 13/00 709/201 |
| 2011/0159578 A1* | 6/2011 | Godsey | G01N 35/1002 435/287.1 |
| 2011/0291020 A1* | 12/2011 | Iwanczyk | G01T 1/242 250/394 |
| 2012/0210041 A1* | 8/2012 | Flynn | G06F 3/0656 711/3 |
| 2016/0069968 A1* | 3/2016 | Rothberg | G01R 33/58 324/322 |
| 2016/0259376 A1 | 9/2016 | Christfort | |
| 2017/0258427 A1* | 9/2017 | Risher-Kelly | A61B 6/4441 |
| 2017/0363486 A1* | 12/2017 | Okulov | G01L 1/005 |
| 2019/0213366 A1* | 7/2019 | Gould | A47B 81/00 |
| 2020/0101455 A1* | 4/2020 | Veiseh | B01L 3/5085 |
| 2020/0176121 A1* | 6/2020 | Dalal | G16H 50/30 |
| 2021/0165060 A1* | 6/2021 | Poole | G01R 33/48 |

OTHER PUBLICATIONS

International Search Report dated Jun. 13, 2019 in International Application No. PCT/EP2019/060247 English Translation.

* cited by examiner

DATA ACQUISITION DEVICE FOR THE INSTRUMENTATION OF A STRUCTURE

CROSS REFERENCE TO RELATED APPLICATIONS

This application is a National Stage of International Application No. PCT/EP2019/060247 filed Apr. 19, 2019, claiming priority based on French Patent Application No. 1853458 filed Apr. 19, 2018, the entire contents of each of which are herein incorporated by reference in their entireties.

FIELD OF THE INVENTION

The invention relates to a data acquisition device, intended for the instrumentation of vehicles (land vehicle, aircraft, railway vehicle) or industrial equipment (electrical power production equipment).

PRIOR ART

The instrumentation consists of installing sensors and on-board acquisition devices on vehicles or industrial equipment to be tested, in order to accomplish measurements during tests or quality controls. The data can for example be physical data (shocks, vibrations) or environmental data (temperature, humidity, pressure). The data acquisition devices collect and format the data originating from the different sensors.

Figure 1:
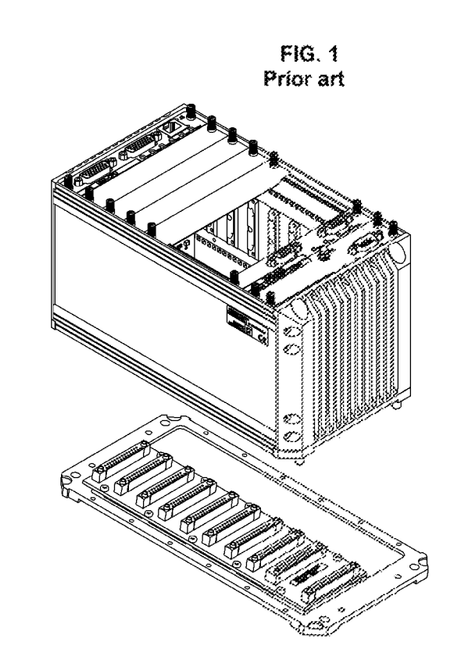
FIG. 1, already discussed, shows schematically a first example of a data acquisition device of the prior art, FIG. 2, already discussed, shows schematically a second example of a data acquisition device of the prior art.

FIG. 1 shows schematically a first example of a known acquisition device. The acquisition device comprises a chassis and a series of electronic modules capable of being inserted into the chassis in the manner of drawers. The chassis comprises lateral walls delimiting an insertion opening and a bottom wall. The lateral walls are provided with slides into which the electronic modules can be inserted. The device also comprises an electronic board attached to the bottom wall inside the chassis. The electronic board comprises a series of connectors. Each electronic module is inserted into one of the slides and is electrically connected to the electronic board via one of the connectors. This device allows the assembly of different electronic modules able to acquire and process signals originating from different sensors, as necessary.

One disadvantage of this device is that it is bulky, so that it cannot generally be installed in proximity to sensors. Thus, cables must be installed to connect the different sensors to the acquisition device. Moreover, the chassis must be attached to the structure to be instrumented by means of an adapter plate and attachment screws. As a result, the device is bulky and its installation requires providing cable passages and drilling holes in the structure to be instrumented for the insertion of attachment screws. Thus, the instrumentation of the vehicle or of the equipment to be tested can substantially modify the performance of the vehicle or of the equipment. This impact of the instrumentation on the performance of the vehicle or of the equipment to be tested must generally be evaluated, prior to the testing, in order to correct the measurements obtained when that is possible. Moreover, once the vehicle or equipment to be tested has been instrumented, it is generally not possible to easily modify the configuration of the sensors, of the acquisition device or of the cabling, for example when it is desired to add a sensor.

Figure 2:
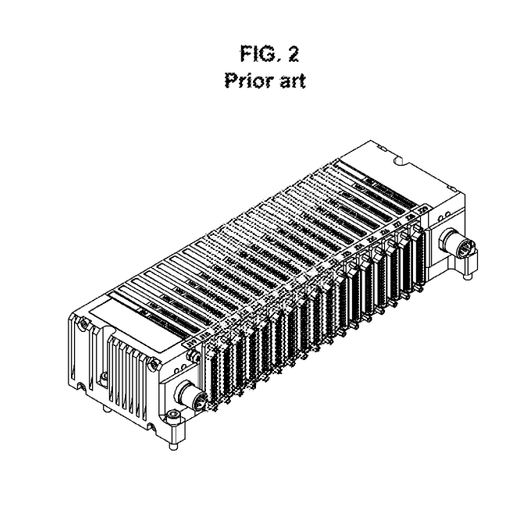

FIG. 2 shows schematically a second example of an acquisition device. The acquisition device comprises a series of electronic modules. Each module comprises an individual casing. The module casings are assembled together to form a stack, and the electronic modules are connected together by means of connectors.

A device of this type is generally less bulky than the device shown in FIG. 1. However, this device also has the disadvantage that it must be attached to the structure to be instrumented by means of an adapter plate and attachment screws. Moreover, cables must also be installed to connect the different sensors to the acquisition device. Thus, as with the device of FIG. 1, the device shown in FIG. 2 does not allow easy modification of the configuration of the sensors, of the acquisition device and of the cabling once the vehicle or the equipment to be tested has been instrumented.

SUMMARY OF THE INVENTION

One goal of the invention is to propose a data acquisition device which has reduced bulk and impact on the structure to be instrumented, and which can be used under severe environmental conditions.

This goal is achieved within the scope of the present invention thanks to a data acquisition device comprising:
  a casing comprising a lateral wall delimiting a cavity,
  a plurality of electronic modules able to be stacked in the cavity in a stacking direction,
each electronic module having a first face and a second face opposite to the first face, and comprising a first set of conductive tracks extending over the first face, and a second set of conductive tracks extending over the second face, the first set of conductive tracks comprising at least one conductive track dedicated to the transmission of a data signal, and the second set of conductive tracks comprising at least one conductive track dedicated to the transmission of a data signal and connected electrically to the conductive track dedicated to the transmission of the data signal of the first set of conductive tracks via an electrical connection passage extending inside the electronic module,
  one or more connector block(s), each connector block being positioned between two adjacent electronic modules of the stack to establish an electrical connection between each track of the first set of conductive tracks of one of the electronic modules and a corresponding track of the second set of tracks of the other of the electronic modules, and
  a pressing member able to apply a compression force to the electronic modules, parallel to the stacking direction, the compression force tending to deform each connector block by increasing a dimension of the connector block in a radial direction, perpendicular to the stacking direction, so as to maintain each connector block supported against the lateral wall of the casing.

In a device of this type, transmission of data between the different electronic modules is carried out thanks to the dedicated conductive tracks present on the faces of each module. Thus, the electrical connection of an electronic module of the stack is ensured by the other modules, and not due to an electronic board or specific cabling.

As the connector block(s) is (are) held supported against the lateral wall, the connector block(s) immobilize the electronic modules in the casing. The electronic modules are thus protected against vibration and shocks. As a result, the acquisition device can be used for the acquisition of data under severe environmental conditions.

In one embodiment of the invention, the conductive tracks are arranged so that when the electronic modules are stacked in the cavity, regardless of the stacking order of the electronic modules in the cavity, the conductive track dedicated to the transmission of the data signal on the second face of one of the modules faces the conductive track dedicated to the transmission of the data signal of the first face of another adjacent module in the stack, to propagate the data signal from one module to another through the totality of the stack.

As the electronic modules can be stacked in the casing in any order, without their functions being modified, it is possible to easily reconfigure the device: it is sufficient to simply add and/or withdraw one or more electronic module(s) as necessary.

The proposed device can also have one of the following features:
- at least one of the electronic modules is able to generate the data signal,
- the first set of conductive tracks comprises at least one conductive track dedicated to the transmission of a synchronization signal, and the second set of conductive tracks comprises at least one conductive track dedicated to the transmission of the synchronization signal and connected electrically to the conductive track dedicated to the transmission of the synchronization signal of the second set of conductive tracks via an electrical connection passage extending inside the electronic module, the tracks being arranged so that when the electronic modules are stacked in the cavity, the conductive track dedicated to the transmission of the synchronization signal on the second face of one of the modules faces the conductive track dedicated to the transmission of the synchronization signal on the first face of another of the modules,
- the first set of conductive tracks comprises at least one conductive track dedicated to the transmission of a power supply signal, and the second set of conductive tracks comprises at least one conductive track dedicated to the transmission of the power supply signal and connected electrically to the conductive track dedicated to the transmission of the power supply signal of the second set of tracks via an electrical connection passage extending inside the electronic module, the tracks being arranged so that when the electronic modules are stacked in the cavity, the conductive track dedicated to the transmission of the power supply signal on the second face of one of the modules faces the conductive track dedicated to the transmission of the power supply signal on the first face of another of the modules,
- the first set of conductive tracks comprises are least one conductive track dedicated to the transmission of the data signal, one conductive track dedicated to the transmission of the synchronization signal and one conductive track dedicated to the transmission of the power supply signal, and the second set of conductive tracks comprises at least one conductive track dedicated to the transmission of the data signal, one conductive track dedicated to the transmission of the synchronization signal and one conductive track dedicated to the transmission of the power supply signal, connected electrically respectively to the conductive track dedicated to the transmission of the data signal, to the conductive track dedicated to the transmission of the synchronization signal and to the conductive track dedicated to the transmission of the power supply signal of the first set of conductive tracks, via electrical connection passages extending inside the electronic module from the first face to the second face,
- the pressing member comprises an elastic return member, such as a compression spring for example,
- the acquisition device comprises a first end plate, the pressing member being positioned between the body of the cap and the first end plate, so that the pressing member applies the compression force to the electronic modules via the first end plate,
- the acquisition device comprises a second end plate, and the electronic modules are positioned between the first end plate and the second end plate,
- the casing has an opening, the acquisition device also comprising:
- a cap comprising a body able to block the opening of the casing, and
- a connector extending through the body of the cap, the connector being able to be connected to a communication cable, to transmit the data signal between one or more of the electronic modules positioned inside the cavity and distant equipment located outside the casing,
- the acquisition device comprises a first end plate positioned between the cap and the stack, and the first end plate has a third face and comprises a third set of conductive tracks extending over the third face, the tracks of the third set of conductive tracks being, on the one hand, connected electrically to the connecter and being able, on the other hand, to be connected electrically to the tracks of the first set of conductive tracks, or of the second set of conductive tracks of one of the electronic modules,
- the acquisition device comprises a flexible electrical connector cable connecting the tracks of the third set of conductive tracks to the connector,
- each connector block is formed from an anisotropic electrically conductive material having high electrical conductivity (i.e. a low electrical resistance, typically less than 1 Ohm, for example a few milliohms) in a first direction parallel to a stacking direction of the electronic modules and a low electrical conductivity (i.e. a high electrical resistance, typically greater than $10^9$ Ohms, for example on the order of a few Gigaohms) in a direction perpendicular to the stacking direction of the electronic modules, so as to establish the electrical connection between each track of the first set of conductive tracks of one of the electronic modules and a corresponding track of the second set of tracks of the other of the electronic modules,
- the anisotropic electrically conductive material comprises a non-conductive matrix and a plurality of electrically conductive elements dispersed in the matrix, the electrically conductive elements being able to conduct electrical signals only in the first direction,
- the matrix is formed of an elastomeric material,
- each electronic module comprises a first electronic board having the first face on which the first set of conductive tracks extends, a second electronic board having the second face on which the second set of conductive tracks extends, and one or more electronic component(s) positioned between the first electronic board and the second electronic board and connected to one of the tracks of the first set of conductive tracks and to one of the tracks of the second set of conductive tracks,
- one of the electronic components is able to receive an input electrical signal containing measurement data via the track of the first set of conductive tracks to which the electronic component is connected, to apply processing to the measurement data, and to generate an electrical output signal containing the processed measurement data via the track of the second set of conductive tracks to which the electronic component is connected, one of the electronic components is a battery able to generate a voltage between the track of the first set of conductive tracks to which the electronic component is connected and the track of the second set of conductive tracks to which the electronic component is connected, one of the electronic components is a sensor able to generate an electrical measurement signal containing measurement data, such as for example a vibration sensor, an acceleration sensor, an acoustic sensor, a temperature sensor or a pressure sensor, each electronic module comprises a potting material filling the space between the components and the electronic boards, each module comprises lateral walls extending between the first electronic board and the second electronic board, so as to delimit, with the first electronic board and the second electronic board, a protective housing containing the electronic component(s), the tracks of the first set of conductive tracks and of the second set of conductive tracks are circular and positioned concentrically, the casing comprises a lateral wall with a cylinder-of-revolution shape surrounding the cavity.

The invention also relates to a data acquisition system, comprising:

a plurality of acquisition devices as defined previously, able to be attached at different locations of a structure to be instrumented, and a data concentrator able to be connected to the different acquisition devices via communication cables or via wireless connections to receive measurement data signals originating from the different acquisition devices.

In one embodiment of the invention, the acquisition system also comprises a plurality of sensors able to be attached to the structure to be instrumented, each sensor being connected to one of the acquisition devices to transmit measurement data to the acquisition device.

PRESENTATION OF THE DRAWINGS

Other features and advantages will be revealed by the description that follows, which is purely illustrative and not limiting, and must be read with reference to the appended figures, in which.

DETAILED DESCRIPTION OF AN EMBODIMENT

Figure 3:
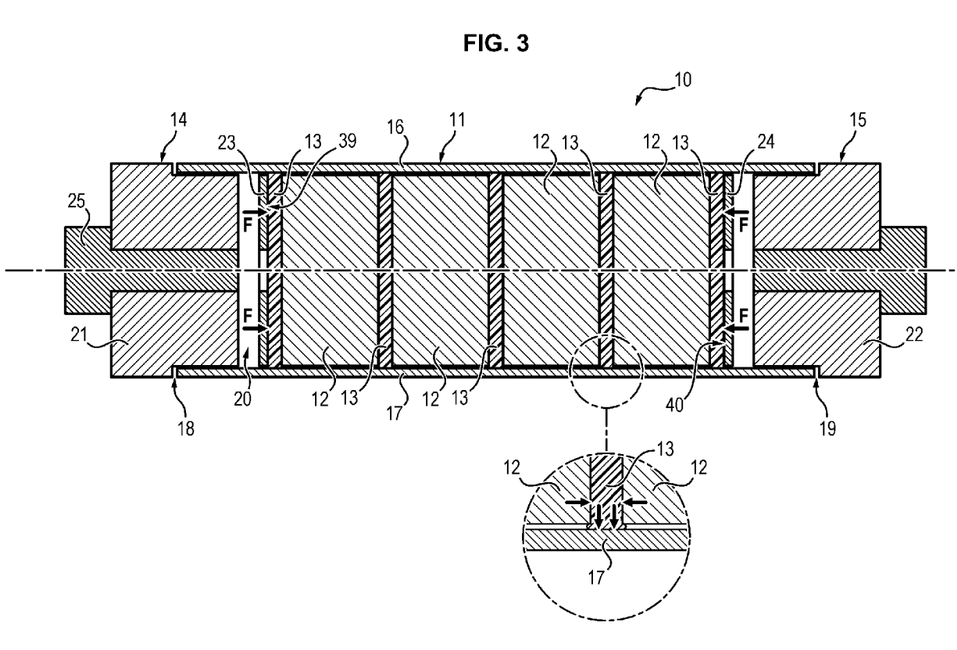
FIG. 3 shows schematically a data acquisition device in accordance with a possible embodiment of the invention.

In FIG. 3, the data acquisition device 10 comprises a casing 11, a plurality of electronic modules 12 and a plurality of connector blocks 13.

The casing 11 comprises two end caps 14, 15 and a body 16. The body 16 comprises a lateral wall 17 with a generally cylindrical shape, for example a cylinder of revolution having an axis X. The lateral wall 17 has two free edges 18, 19, delimiting two end openings. Each cap 14, 15 is able to be introduced into one of the openings and to be attached to the body 16, for example by screwing or by any other means. The lateral wall 17 delimits a cavity 20 able to receive the electronic modules 12 and the connector blocks 13. The cavity 20 extends between the two openings of the casing 11.

The electronic modules 12 and the connector blocks 13 are able to be introduced into the interior of the cavity 20 of the casing via one of the openings. Moreover, the electronic modules 12 and the connector blocks 13 are able to be stacked in the cavity 20 in a stacking direction parallel to the axis X of the casing 11. More precisely, the electronic modules 12 and the connector blocks 13 are stacked in alternation with one another so that each electronic module 12 is located between two connector blocks 13 in the stack.

Each electronic module 12 is able to provide a function particular to it. For example, the electronic modules can include one or more sensor(s) (such as an accelerometer or a pressure sensor for example), data processing components, a memory and a battery.

The electronic modules 12 can also include an intermediate module, i.e. an electronic module which does not fulfill any specific function, but which serves to complete the stack in the case where the cavity 20 has a predetermined volume and where the number of necessary electronic modules 12 does not allow the entire volume of the cavity 20 to be filled.

Each cap 14, 15 comprises a blocking part 21, 22 able to be attached to the body 16 to close one of the openings and an end plate 23, 24.

Once the caps 14, 15 are attached to the body 16, the stack consisting of the electrical modules 12 and the connector blocks 13 is located between the two end plates 23 and 24.

Figure 4:
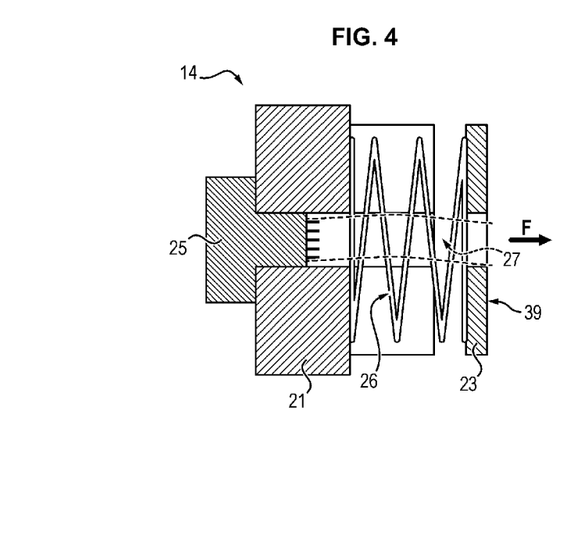
FIG. 4 shows schematically a cap of the acquisition device.

As illustrated in FIG. 4, the cap 14 comprises a connector 25 extending through the blocking part 21 and a pressing member 26.

The pressing member 26 is positioned between the blocking part 21 and the end plate 23 of the cap 14. The pressing member 26 is able to apply a compression force F to the stack, parallel to the stacking direction, to maintain the electronic modules 12 and the connector blocks 13 in compression against one another. The pressing member 26 applies the compression force F to the electronic modules 12 via the end plate 23.

As illustrated in FIG. 4, the pressing member 26 can comprise an elastic return element, such as a compression spring for example.

The cap 14 also comprises a flexible electrical connector cable 27 connecting the conductive tracks of the end plate 23 to the connector 25.

The connector 25 is able to be connected to a communication cable, to transmit signals between one or more electronic 12 positioned in the interior of the cavity 20 and distant equipment located outside the casing 11.

Figure 5:
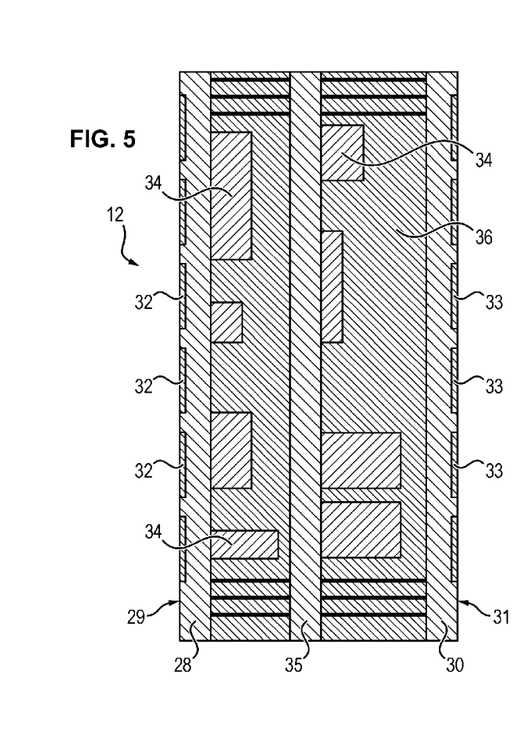
FIG. 5 shows schematically, in section view, an electronic module forming part of the data acquisition device.
Figure 6:
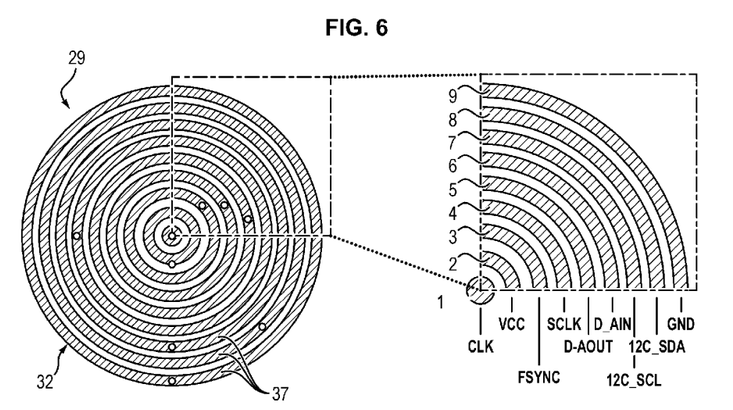
FIG. 6 shows schematically a first face of an electronic module.
Figure 7:
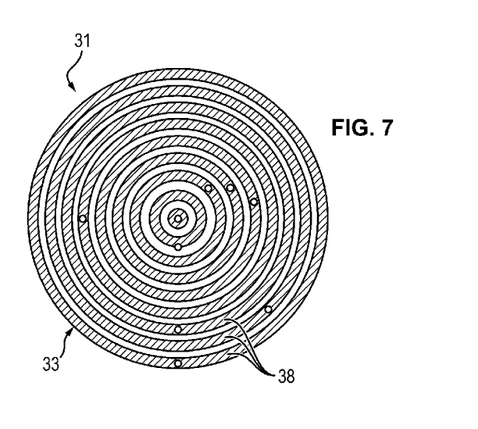
FIG. 7 shows schematically a second face of the electronic module.

FIGS. 5 to 7 show schematically an electronic module 12. The electronic module 12 has the shape of a cylindrical chip.

In the example illustrated in FIG. 5, the electronic module 12 comprises a first electronic board 28 having a first planar face 29 and a second electronic board 30 having a second planar face 31, opposite to the first planar face 29. The planar faces 29 and 31 extend perpendicular to the stacking direction. The electronic module 12 also comprises a first set of conductive tracks 32 extending over the first face 29, and a second set of conductive tracks 33 extending over the second face 31.

The electronic module 12 also comprises a plurality of electrical connections 42 positioned between the two electronic boards 28 and 30 and each extends from the first face 29 until the second face 31 so as to connect the tracks 32 and 33 two by two. The electronic module 12 also comprises a plurality of electronic components 34 positioned between the two electronic boards 28 and 30 and connected to certain of the electrical connections 42. The electronic module 12 can also comprise one or more interleaved boards 35 positioned between the first electronic board 28 and the second electronic board 30, and supporting the electronic components 34. The electronic module 12 also comprises a potting material 36 filling the space between the components 34 and the electronic boards 28, 30, 35. In this manner, the electrical connections 42 and the electronic components 34 are protected from mechanical loads (vibrations, shock, pressure variations) and ambient humidity by the potting material 36. Moreover, the potting material 36 can be selected to make the electronic module 12 airtight.

Alternatively, each module 12 can comprise lateral walls extending between the first electronic board 28 and the second electronic board 30, so as to delimit, with the first electronic board and the second electronic board, a protective housing containing the electrical connections 42 and the electronic component(s) 34.

As illustrated in FIG. 6, the first set of conductive tracks 32 comprises a plurality of circular conductive tracks 37 arranged concentrically according to a first pattern.

As illustrated in FIG. 7, the second set of conductive tracks 33 comprises a plurality of circular conductive tracks 38 arranged concentrically according to a second pattern. The second pattern is identical to the first pattern.

The first set of tracks 32 is identical from one electronic module 12 to another. Likewise, the second set of tracks 33 is identical from one electronic module 12 to another.

In addition, in the example illustrated in FIGS. 6 and 7, the first set of tracks 32 is symmetrical with the second set of tracks 33. More precisely, in this example, the first set of tracks 32 is identical to the second set of tracks 33.

Each of the first set of tracks 32 and the second set of tracks 33 can comprise between 3 and 10 tracks.

Figure 8:
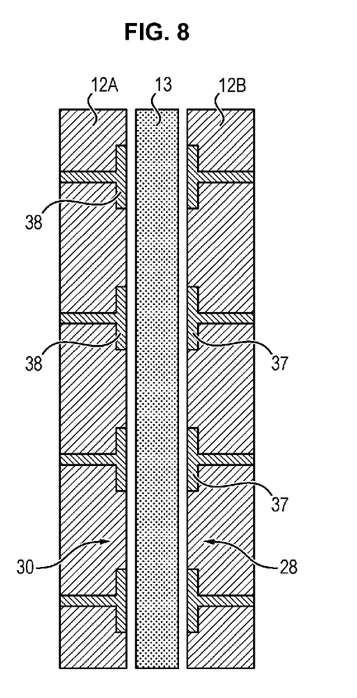
FIG. 8 shows schematically a connector block positioned between two adjacent electronic modules.

In the example illustrated in FIGS. 7 and 8, the first set of tracks 32 and the second set of tracks 33 each comprise 9 distinct tracks, numbered from 1 to 9. Each track is dedicated to the transmission of a predetermined signal.

In the example illustrated in FIGS. 6 and 7, tracks no. 1 and no. 3 are dedicated to the transmission of synchronization signals (called "CLK" and "FSYNC"), tracks no. 2 and 9 are dedicated to the transmission of power supply signals (called "VCC" and "GND") and tracks no. 4 to 8 are dedicated to the transmission of data signals (called "SCLK," "D_AOUT," "D_AIN," "I2C_SCL," "I2C_SDA").

The conductive tracks 37 and 38 are thus arranged so that when the electronic modules 12 are stacked in the cavity 20, each of the conductive tracks no. 1 to 9 of the second face 31 of an electronic module faces a corresponding conductive track no. 1 to 9 of the first face 29 of an adjacent electronic module in the stack. In this manner, the signals are propagated from one electronic module 12 to another through the stack, regardless of the stacking order of the electronic modules 12 in the cavity 20.

Moreover, the first end plate 23 has a first support face 39 directed toward the stack. The first end plate 23 comprises a third set of conductive tracks extending over the first support face 39. The third set of conductive tracks is identical to the second set of conductive tracks 33 illustrated in FIG. 7. The flexible electrical connector cable 27 connects the tracks of the third set of conductive tracks to the connector 25. The conductive tracks are thus arranged so that when the electronic modules 12 are stacked in the cavity 20, each of conductive tracks no. 1 to 9 of the first face 29 of the electronic module 12 located at the first end of the stack faces a corresponding conductive track no. 1 to 9 of the first support face 39 of the first end plate 23. Thus, the tracks of the third set of conductive tracks are on the one hand connected electrically to the connector 25 and on the other hand connected to the tracks 37 of the first set of conductive tracks 32 of the electronic module 12 located at the first end of the stack.

Likewise, the second end plate 24 has a second support face 40 directed toward the stack. The second end plate 24 comprises a fourth set of conductive tracks extending over the second support face 40. The fourth set of conductive tracks is identical to the first set of conductive tracks 32. The conductive tracks are thus arranged do that when the electronic modules 12 are stacked in the cavity 20, each of the conductive tracks no. 1 to 9 of the second face 31 of the electronic module 12 located at the second end of the stack faces a corresponding conductive track no. 1 to 9 of the second support face 40. The tracks of the fourth set of conductive tracks are thus connected to the tracks 38 of the second set of conductive tracks 33 of the electronic module 12 located at the second end of the stack, opposite to the first end of the stack.

As illustrated in FIG. 8, each connector block 13 has the shape of a disk and is able to be positioned between two adjacent electronic modules 12 of the stack. More precisely, the connector block 13 illustrated in FIG. 8 is positioned between a second face 31 of a first electronic module 12A and a first face 29 of a second electronic module 12B positioned facing the second face 31. The connector block is able to establish an electrical connection between each track 37 of the first set of conductive tracks 32 of the first electronic module 12A and a corresponding track 38 of the second set of tracks 33 of the second electronic module 12B.

Each connector block 13 is formed from an anisotropic electrically conductive material having high electrical conductivity (i.e. low resistance, on the order of 1 ohm) in a first direction parallel to the stacking direction of the electronic modules 12 (i.e. parallel to the direction of the axis X) and low electrical conductivity (i.e. high resistance, for example on the order of $10^{12}$ ohms) in a direction perpendicular to the stacking direction of the electronic modules 12, so as to establish an electrical connection between each track 37 of the first set of conductive tracks 32 of the electronic module 12b and a corresponding track 38 of the second set of tracks 33 of the electronic module 12A.

The anisotropic electrically conductive material can comprise an electrically non-conductive matrix, formed for example of an elastomeric material, and a plurality of electrically conductive elements dispersed in the matrix, the electrically conductive elements being able to conduct signals only in the stacking direction.

When they are subjected to a compression force, the connector blocks 13 have a tendency to deform. More precisely, the thickness of the connector block 13, measured in the stacking direction, tends to diminish, while the radius of the connector block 13, measured in a radial direction, perpendicular to the stacking direction, tends to increase. The connection blocks 13 thus occupy the space between the electronic modules 13 and the end plates 23 and 24, and are supported against the lateral wall 17 of the casing 11. In this manner, the connection blocks 13 immobilize the electronic modules 12 in the casing 11, protect the electronic modules 12 against vibration and shock.

Each connector block 13 has an annular external surface. As illustrated in FIG. 3, each connector block 13 is dimensioned so that, under the influence of the compression force F, the connector block 13 undergoes radial expansion. This has the effect that the external annular surface of the connector block 13 is pressed against the internal cylindrical surface of the lateral wall 17. The material of the connector block 13 is squashed against the internal surface of the lateral wall 17. In this manner, the connector blocks 13 separate the electronic modules 13 in an airtight manner. The electronic modules 13 are thus protected against humidity or penetration of contaminants inside the cavity 20.

Moreover, the connector blocks 13 can be formed of a material allowing the conduction of heat which can be generated by the electronic modules 12 to the lateral wall of the casing, in order to dissipate the heat externally. In order to further improve the dissipation of heat, the casing 11 can comprise fines arranged on the outer surface of the lateral wall 17.

Figure 9:
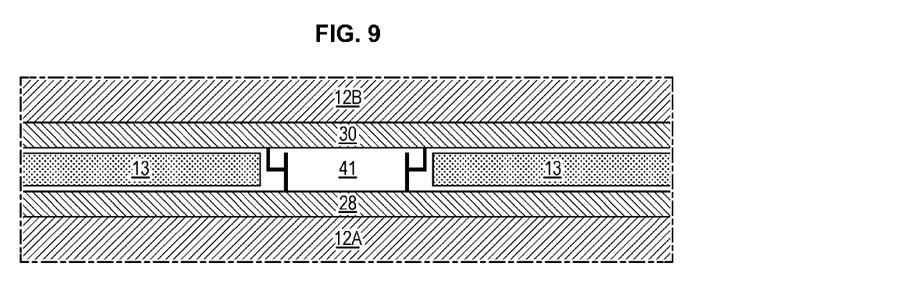
FIG. 9 shows schematically another connector block positioned between two adjacent electronic modules.

FIG. 9 shows schematically another example of a connector block 13 which can be positioned between two adjacent electronic modules 12. The connector block 13 has an annular shape. The acquisition device also comprises a connector 41 positioned in the center of the connector block 13.

Due to the disposition of the conductive tracks 37 and 38 on the faces of the electronic modules 12, the electrical signals such as the synchronization signals, the power supply signals and the data signals are transmitted from one module 12 to another through the stack, this regardless of the order of the electronic modules 12 in the stack.

Each electronic module 12 can propagate data signals, synchronization signals or power supply signals in the following manner:
- the electronic module 12 transmits the signal between a track 37 of the first set of conductive tracks 32 and a corresponding track 38 of the second set of conductive tracks 33, without using or processing the signal,
- the electronic module 12 transmits the signal between a track 37 of the first set of conductive tracks 32 and a corresponding track 38 of the second set conductive tracks 33, and at the same time uses the signal to cause its electronic components to function.

FIGS. 10 to 14 show schematically different examples of function which can be performed by an electronic module 12.

Figure 10:
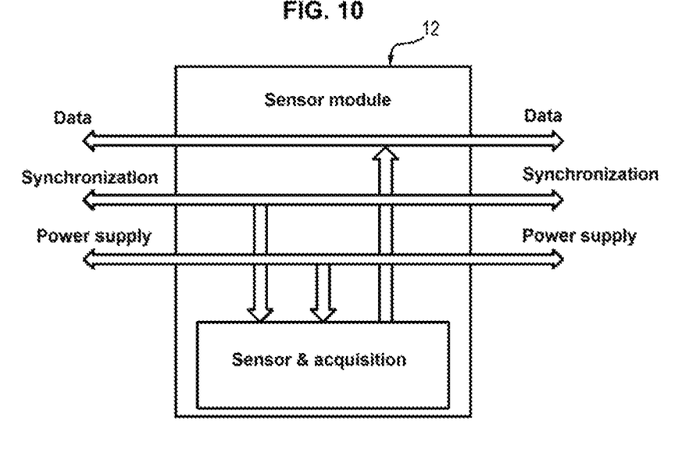
FIGS. 10 to 14 show schematically different functions which can be performed by an electronic module.

In FIG. 10, the electronic module 12 is a sensor module.

The electronic module comprises a sensor able to generate a data signal including measurement data (for example an accelerometer or a pressure sensor). The electronic module transmits the data signal between one track of the first set of conductive tracks and a track of the second set of conductive tracks. The electronic module uses a synchronization signal to synchronize its electronic components which require it (typically analog/digital conversion components), while still transmitting the synchronization signal between a track of the first set of conductive tracks and a corresponding track of the second set of conductive tracks. Likewise, the electronic module uses a power signal to supply its electronic components, while transmitting the power signal between a track of the first set of conductive tracks and corresponding track of the second set of conductive tracks.

Figure 11:
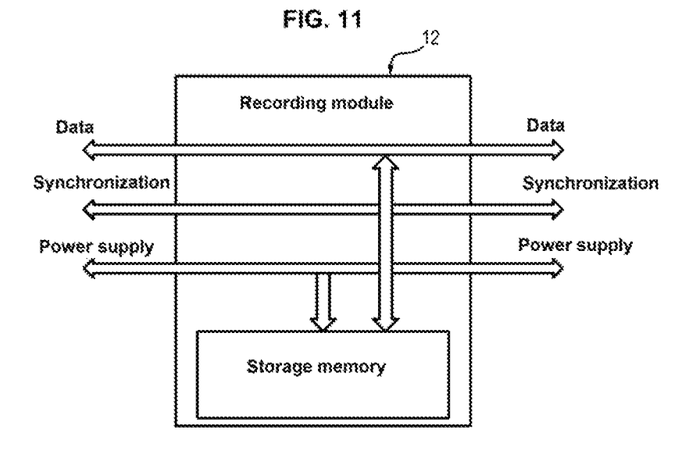

In FIG. 11, the electronic module 12 is a data recording module.

The electronic module comprises a memory configured to record data from the data signal. The electronic module transmits the data signal between a track of the first set of conductive tracks and a corresponding track of the second set of conductive tracks. The electronic module uses the power signal to supply its electronic components, while still transmitting the power signal between a track of the first set of conductive tracks and a corresponding track of the second set of conductive tracks. Moreover, the electronic module transmits the synchronization signal between a track of the first assembly of conductive tracks and a corresponding track of the second set of conductive tracks, without using or processing the signal.

Figure 12:
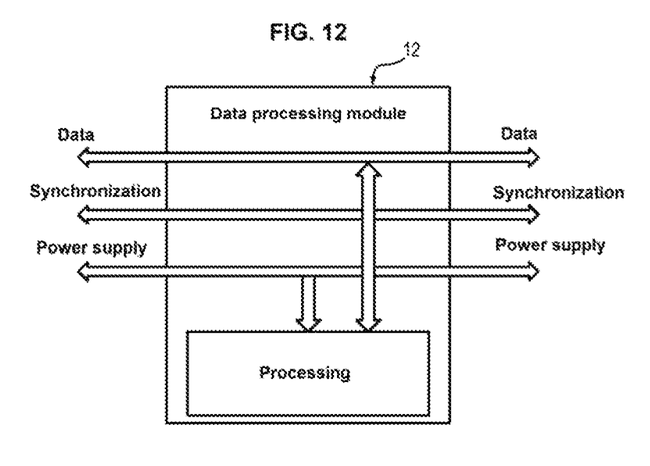

In FIG. 12, the electronic module 12 is a processing module.

The electronic module is configured to process the data signal that it receives and to generate a processed data signal. The electronic module uses the power signal and the synchronization signal to supply its electronic components, while still transmitting the power signal and the synchronization signal between the tracks of the first set of conductive tracks and the tracks of the second set of conductive tracks.

Figure 13:
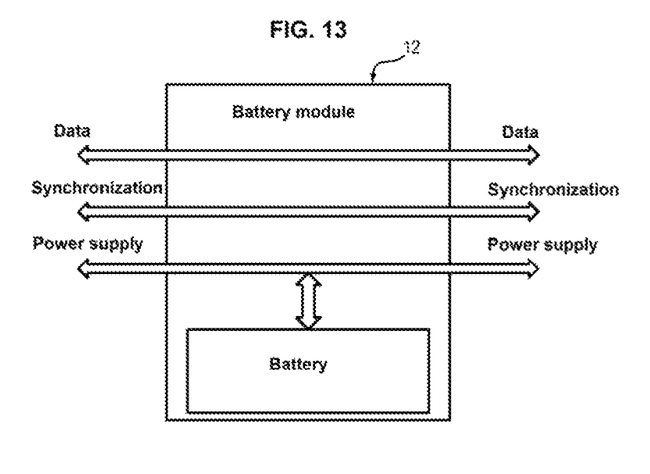

In FIG. 13, the electronic module 12 is a power supply module, one of the components of which is a battery.

The electronic module is configured to generate a power supply signal. The electronic module transmits the data signal between a track of the first set of conductive tracks and a corresponding track of the second set of conductive tracks, without using or processing the signal. Likewise, the electronic module transmits the synchronization signal between a track of the first set of conductive tracks and a corresponding track of the second set of conductive tracks, without using or processing the signal.

Figure 14:
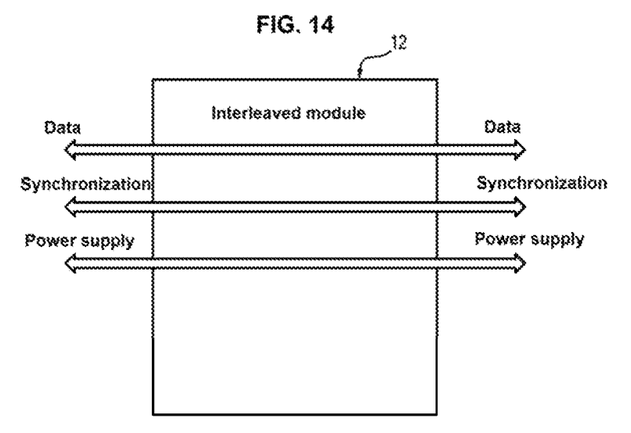

In FIG. 14, the electronic module 12 is an interleaved module.

In this case, the electronic module does not perform any specific function, aside from adapting the total size of the stack to a desired dimension. The electronic module transmits the data signal, the synchronization signal and the power signal between a respective track of the first set of conductive tracks and a corresponding respective track of the second set of conductive tracks, without using or processing the signal.

FIGS. 15 to 18 show schematically different functions which can be performed by one of the caps 14 or 15.

Figure 15:
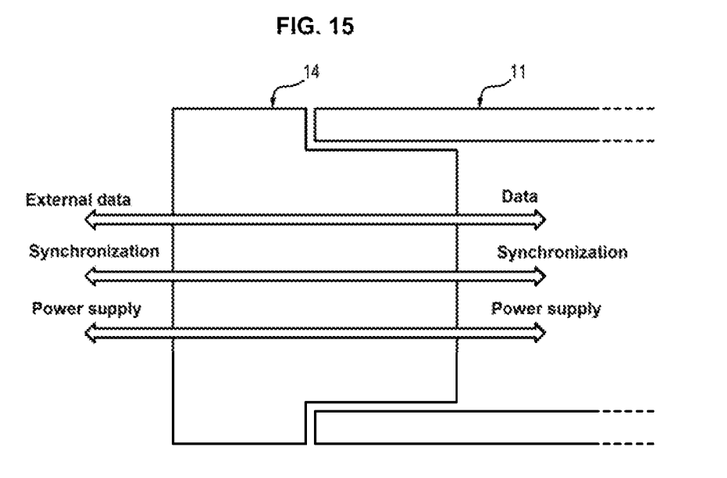
FIGS. 15 to 18 show schematically different functions which can be performed by an end assembly including a cap of the acquisition device.

In FIG. 15, the cap 14 is a passive cap, i.e. it does not perform any specific function.

In this case, the tracks of the third set of conductive tracks are connected electrically to the connector. Thus, the connector receives the data signal, the synchronization signal and the power supply signal. These signals can be transmitted via a communication cable or a wireless connected to distant equipment located outside the casing of the device.

Figure 16:
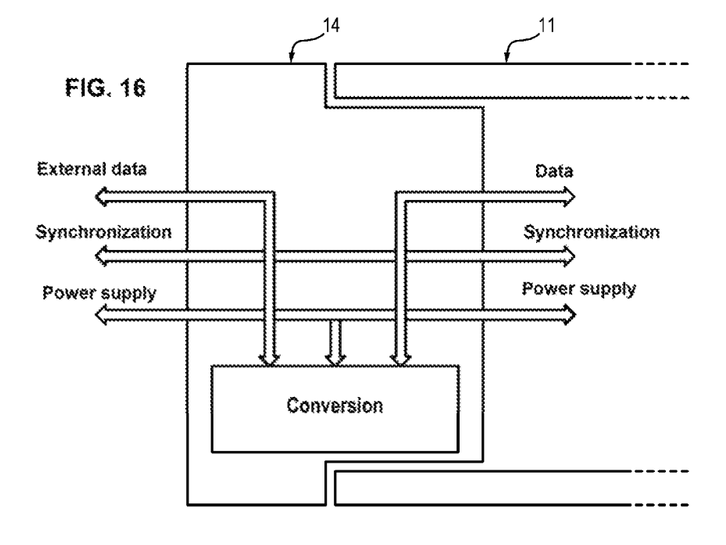
Figure 17:
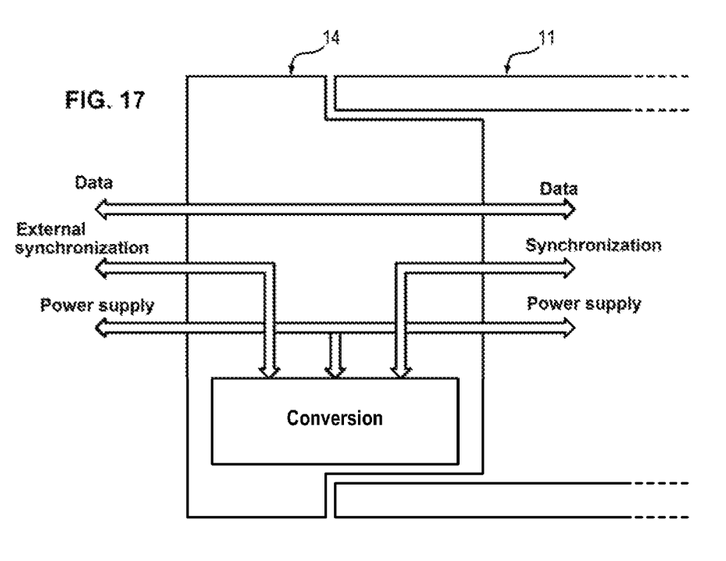
Figure 18:
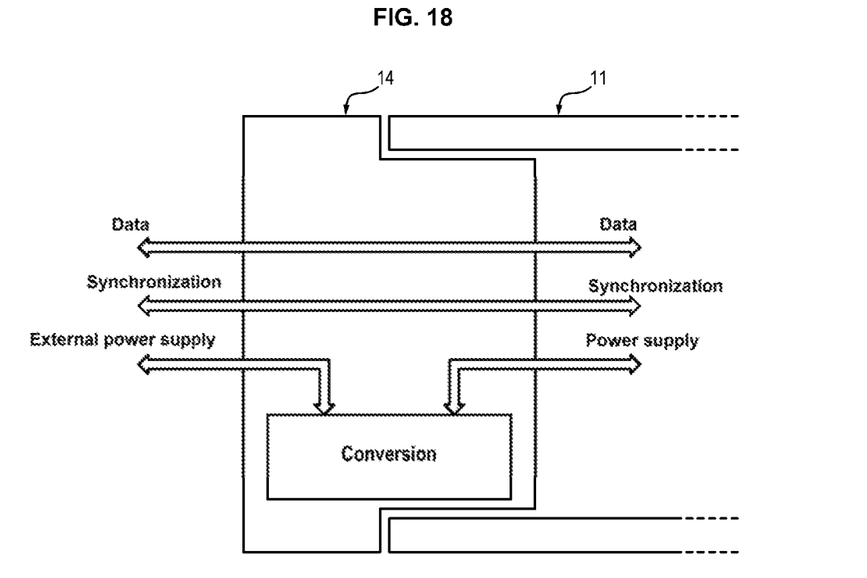

FIGS. 16 to 18 illustrate embodiments of the cap, in which the cap is active, i.e. it performs a function peculiar to it.

In FIG. 16, the cap 14 includes a conversion component, able to convert the data signal which propagates through the different modules of the stack in a first format into a data signal having a second format, different from the first format. The data signal in the second format is able to be broadcast on a communication cable or via a wireless connection to distant equipment located outside the casing of the device. The conversion component is also able to carry out a reverse conversion, i.e. to convert a data signal in the second format into a data signal in the first format.

In FIG. 17, the cap 14 includes a conversion component able to convert the synchronization signal which propagates through the different modules of the stack in a first format into a synchronization signal having a second format, different from the first format. The synchronization signal in the second format is able to be broadcast on a communication cable or via a wireless connection to distant equipment located outside the casing of the device. The conversion component is also able to accomplish a reverse conversion, i.e. to convert a synchronization signal in the second format into a synchronization signal in the first format.

In FIG. 18, the cap 14 includes a conversion component, able to convert the power supply signal which propagates through the different modules of the stack in a first format (for example a first voltage level) into a signal having a second format (for example a second voltage level) different from the first format. The power supply signal in the second format is able to be broadcast on a communication cable to distant equipment located outside the casing of the device. The conversion component is also able to accomplish a reverse conversion, i.e. to convert a power supply signal in the second format into a power supply signal in the first format.

A cap performing several of the three functions illustrated in FIGS. 16 to 18 could of course be considered.

Figure 19:
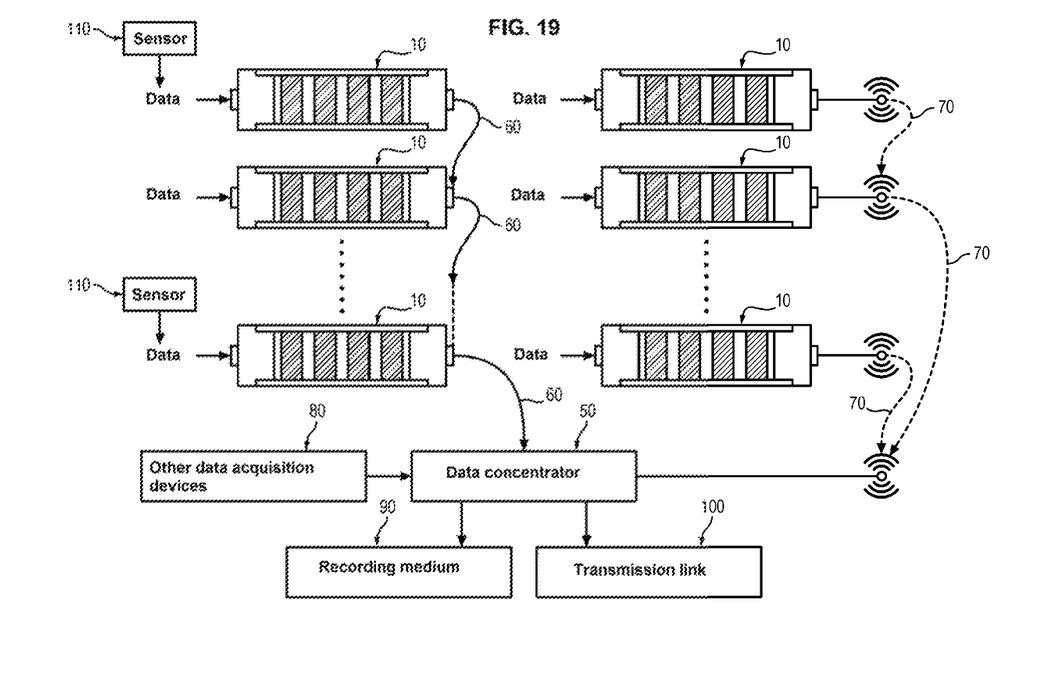
FIG. 19 shows schematically a data acquisition system comprising a plurality of acquisition devices.

FIG. 19 shows schematically a data acquisition system.

The data acquisition system comprises a plurality of data acquisition devices 10 and a data concentrator 50.

The data acquisition system comprises a plurality of sensors attached at different positions to a structure to be instrumented. Among these sensors, certain sensors can be separate sensors 110, distinct from the data acquisition devices 10. In this case, each sensor 110 is attached to the structure to be instrumented and is connected to an associated data acquisition device 10. The sensor 110 is connected to the associated acquisition device via a communication cable or a wireless connection so as to transmit measurement data generated by the sensor 110 to the associated data acquisition device 10. Among the sensors, other sensors can be integrated into data acquisition devices 10. In this case, the sensor is part of an electronic module of the data acquisition device 10.

Data acquisition devices 10 can be attached to the structure to be instrumented (for example to a cable strand or to a tube) simply, by means of hose clamps or self-locking cable clamps (such as plastic or metal hose clamps generally called "tyraps"), without screws or drilling. The assembly and the disassembly of each acquisition device 10 can be accomplished without tools, which allows rearranging the acquisition assembly as necessary.

Each data acquisition device 10 is connected to another data acquisition device 10 or to a data concentrator 50 via a communication cable 60 or via a wireless connection 70 (for example a radio-frequency connection).

The data concentrator 50 can also be connected to other data acquisition devices 80.

The data concentrator 50 is configured to receive the data signals originating from the different acquisition devices 10 and 80 and to proceed with aggregation (with its own data acquired locally), with filtering (i.e. with the selection of data among the data that it receives), with the recording of the data in a recording medium 90 and/or with the transmission of data to other equipment, such as for example a ground station when the acquisition assembly is installed aboard an aircraft, via a transmission link 100.

The invention claimed is:

1. A data acquisition device comprising:
a casing comprising a lateral wall delimiting a cavity,
a plurality of electronic modules stacked in the cavity in a stacking direction,
each electronic module having a first face and a second face opposite to the first face, and comprising a first set of conductive tracks extending over the first face, and a second set of conductive tracks extending over the second face, the first set of conductive tracks comprising at least one conductive track dedicated to the transmission of a data signal, and the second set of conductive tracks comprising at least one conductive track dedicated to the transmission of the data signal and connected electrically to the conductive track dedicated to the transmission of the data signal of the first set of conductive tracks via an electrical connection passage extending inside the electronic module,
one or more connector block(s), each connector block being positioned between two adjacent electronic modules of the stack to establish an electrical connection between each track of the first set of conductive tracks of one of the electronic modules and a corresponding track of the second set of tracks of the other of the electronic modules, and
a pressing member able to apply a compression force to the electronic modules, parallel to the stacking direction, the compression force tending to deform each connector block by increasing a dimension of the connector block in a radial direction, perpendicular to the stacking direction, so as to maintain each connector block supported against the lateral wall of the casing.

2. The device according to claim 1, wherein the conductive tracks are arranged so that when the electronic modules are stacked in the cavity, regardless of the stacking order of the electronic modules in the cavity, the conductive track dedicated to the transmission of the data signal on the second face of one of the modules faces the conductive track dedicated to the transmission of the data signal of the first face of another adjacent module in the stack, to propagate the data signal from one module to another through the totality of the stack.

3. The device according to claim 1, wherein at least one of the electronic modules is able to generate the data signal.

4. The data acquisition device according to claim 1, wherein the first set of conductive tracks comprises at least one conductive track dedicated to the transmission of a synchronization signal, and the second set of conductive tracks comprises at least one conductive track dedicated to the transmission of the synchronization signal and connected electrically to the conductive track dedicated to the transmission of the synchronization signal of the first set of conductive tracks via an electrical connection passage extending inside the electronic module, the tracks being arranged so that when the electronic modules are stacked in the cavity, the conductive track dedicated to the transmission of the synchronization signal on the second face of one of the modules faces the conductive track dedicated to the transmission of the synchronization signal on the first face of another of the modules.

5. The acquisition device according to claim 1, wherein the first set of conductive tracks comprises at least one conductive track dedicated to the transmission of a power supply signal, and the second set of conductive tracks comprises at least one conductive track dedicated to the transmission of the power supply signal and connected electrically to the conductive track dedicated to the transmission of the power supply signal of the first set of conductive tracks via an electrical connection passage extending inside the electronic module, the tracks being arranged so that when the electronic modules are stacked in the cavity, the conductive track dedicated to the transmission of the power supply signal on the second face of one of the modules faces the conductive track dedicated to the transmission of the power supply signal of the first face of another of the modules.

6. The acquisition device according to claim 1, wherein the first set of conductive tracks comprises at least one conductive track dedicated to the transmission of the data signal, one conductive track dedicated to the transmission of the synchronization signal and one conductive track dedicated to the transmission of the power supply signal, and the second set of conductive tracks comprises at least one conductive track dedicated to the transmission of the data signal, one conductive track dedicated to the transmission of the synchronization signal and one conductive track dedicated to the transmission of the power supply signal, connected electrically respectively to the conductive track dedicated to the transmission of the data signal, to the conductive track dedicated to the transmission of the synchronization signal and to the conductive track dedicated to the transmission of the power supply signal of the first set of conductive tracks, via electrical connection passages extending from the first face until the second face inside the electronic module.

7. The data acquisition device according to claim 1, wherein the casing has an opening, the acquisition device also comprising:
 a cap comprising a body able to block the opening of the casing, and
 a connector extending through the body of the cap, the connector being able to be connected to a communication cable, to transmit the data signal between one or more of the electronic modules positioned inside the cavity and distant equipment located outside the casing.

8. That acquisition device according to claim 7, comprising a first end plate positioned between the cap and the stack, and wherein the first end plate has a third face and comprises a third set of conductive tracks extending over the third face, the tracks of the third set of conductive tracks being, on the one hand, connected electrically to the connector and being able, on the other hand, to be connected electrically to the tracks of the first set of conductive tracks, or of the second set of conductive tracks of one of the electronic modules.

9. The acquisition device according to claim 1, wherein each connection element comprises a block of anisotropic electrically conductive material having high electrical conductivity in a first direction parallel to a direction of the compression force and low electrical conductivity in a direction perpendicular to the compression force, so as to establish the electrical connection between each track of the first set of conductive tracks of one of the electronic modules and a corresponding track of the second set of conductive tracks of the other of the electronic modules.

10. The acquisition device according to claim 9, wherein the anisotropic electrically conductive material comprises a non-conductive matrix and a plurality of electrically conductive elements dispersed in the matrix, the electrically conductive elements being able to conduct electrical signals only in the first direction.

11. The device according to claim 10, wherein the matrix is formed of an elastomeric material.

12. The acquisition device according to claim 1, wherein each electronic module comprises a first electronic board having the first face on which the first set of conductive tracks extends, a second electronic board having the second face on which the second set of conductive tracks extends, and one or more electronic component(s) positioned between the first electronic board and the second electronic board and connected to one of the tracks of the first set of conductive tracks and to one of the tracks of the second set of conductive tracks.

13. The acquisition device according to claim 11, wherein one of the electronic components is able to receive an input electrical signal containing measurement data via the track of the first set of conductive tracks to which the component is connected, to apply processing to the measurement data, and to generate an electrical output signal containing the processed measurement data via the track of the second set of conductive tracks to which the electronic component is connected.

14. The acquisition device according to claim 12, wherein one of the electronic components is a battery able to generate a voltage between the track of the first set of conductive tracks to which the electronic component is connected and the track of the second set of conductive tracks to which the electronic component is connected.

15. The acquisition device according to claim 12, wherein one of the electronic components is a sensor able to generate an electrical measurement signal containing measurement data, such as for example a vibration sensor, an acceleration sensor, an acoustic sensor, a temperature sensor or a pressure sensor.

16. The acquisition device according to claim 12, wherein each electronic module comprises a potting material filling the space between the components and the electronic boards.

17. The acquisition device according to claim 12, wherein each electronic module comprises lateral walls extending between the first electronic board and the second electronic board, so as to delimit, with the first electronic board and the second electronic board, a protective housing containing the electronic component(s).

18. A data acquisition system, comprising:
 a plurality of the acquisition devices according to claim 1, able to be attached at different locations of a structure to be instrumented, and
 a data concentrator able to be connected to the different acquisition devices via communication cables or via wireless connections to receive measurement data signals originating in the different acquisition devices.

* * * * *